United States Patent
Haggag et al.

(10) Patent No.: US 8,345,488 B2
(45) Date of Patent: *Jan. 1, 2013

(54) FLASH MEMORY ARRAY OF FLOATING GATE-BASED NON-VOLATILE MEMORY CELLS

(75) Inventors: Hosam Haggag, Mountain View, CA (US); Alexander Kalnitsky, San Francisco, CA (US); Edgardo Laber, San Jose, CA (US); Prabhjot Singh, San Jose, CA (US); Michael D. Church, Canyon Lake, FL (US)

(73) Assignee: Intersil Americas Inc., Milpitas, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 13/080,814

(22) Filed: Apr. 6, 2011

(65) Prior Publication Data

US 2011/0182126 A1 Jul. 28, 2011

Related U.S. Application Data

(62) Division of application No. 12/711,520, filed on Feb. 24, 2010, now Pat. No. 7,944,745, which is a division of application No. 11/861,102, filed on Sep. 25, 2007, now Pat. No. 7,688,627.

(60) Provisional application No. 60/913,586, filed on Apr. 24, 2007.

(51) Int. Cl.
*G11C 16/04* (2006.01)

(52) U.S. Cl. ......... 365/185.29; 365/185.06; 365/185.08; 365/185.1

(58) Field of Classification Search ............... 365/185.29
See application file for complete search history.

(56) References Cited

U.S. PATENT DOCUMENTS

| | | |
|---|---|---|
| 4,432,072 A | 2/1984 | Chao et al. |
| 4,611,309 A | 9/1986 | Chuang et al. |
| 4,655,601 A | 4/1987 | Suzuki |
| 4,672,580 A | 6/1987 | Yau et al. |
| 5,465,231 A | 11/1995 | Ohsaki |
| 5,680,346 A | 10/1997 | Pathak et al. |
| 5,687,118 A | 11/1997 | Chang |
| 5,719,427 A | 2/1998 | Tong et al. |
| 5,790,455 A | 8/1998 | Caywood |
| 5,880,991 A | 3/1999 | Hsu et al. |
| 5,923,589 A | 7/1999 | Kaida |
| 5,981,335 A | 11/1999 | Chi |

(Continued)

*Primary Examiner* — Son Mai
(74) *Attorney, Agent, or Firm* — Fogg & Powers LLC

(57) ABSTRACT

A flash memory array comprises a plurality of memory cells organized in a matrix of rows and columns. Each of the memory cells includes a floating gate memory transistor having a source region and a drain region, and a coupling capacitor electrically connected to the memory transistor. A plurality of word lines are each electrically connected to the capacitor in each of the memory cells in a respective row. A first set of bit lines are each electrically connected to the drain region of the memory transistor in each of the memory cells in a respective column. A plurality of high voltage access transistors are each electrically connected to a bit line in the first set of bit lines. A second set of bit lines are each electrically connected to the source region of the memory transistor in each of the memory cells in a respective column. Various combinations of voltages can be applied to the word lines and the first and second sets of bit lines in operations to erase, program, inhibit, or read the logic state stored by the memory transistor in one or more of the memory cells.

6 Claims, 4 Drawing Sheets

U.S. PATENT DOCUMENTS

| | | | |
|---|---|---|---|
| 6,025,625 | A | 2/2000 | Chi |
| 6,055,185 | A | 4/2000 | Kalnitsky et al. |
| 6,064,595 | A | 5/2000 | Logie et al. |
| 6,081,451 | A | 6/2000 | Kalnitsky et al. |
| 6,100,560 | A | 8/2000 | Lovett |
| 6,118,691 | A | 9/2000 | Kalnitsky et al. |
| 6,122,204 | A | 9/2000 | Poplevine et al. |
| 6,130,840 | A | 10/2000 | Bergemont et al. |
| 6,137,721 | A | 10/2000 | Kalnitsky et al. |
| 6,137,722 | A | 10/2000 | Kalnitsky et al. |
| 6,137,723 | A | 10/2000 | Bergemont et al. |
| 6,137,724 | A | 10/2000 | Kalnitsky et al. |
| 6,141,246 | A | 10/2000 | Derman et al. |
| 6,157,574 | A | 12/2000 | Kalnitsky et al. |
| 6,222,764 | B1 | 4/2001 | Kelley et al. |
| 6,271,560 | B1 | 8/2001 | Kalnitsky et al. |
| 6,278,635 | B1 | 8/2001 | Hara |
| 6,307,781 | B1 | 10/2001 | Shum |
| 6,396,745 | B1 | 5/2002 | Hong et al. |
| 6,457,108 | B1 | 9/2002 | Hsu |
| 6,512,691 | B2 | 1/2003 | Hsu et al. |
| 6,512,700 | B1 | 1/2003 | McPartland et al. |
| 6,566,683 | B1 | 5/2003 | Ogawa et al. |
| 6,617,637 | B1 | 9/2003 | Hsu et al. |
| 6,654,284 | B2 * | 11/2003 | Hsu et al. ............... 365/185.18 |
| 6,747,890 | B1 | 6/2004 | Kirihata et al. |
| 6,757,196 | B1 | 6/2004 | Tsao et al. |
| 6,795,347 | B2 | 9/2004 | Ausserlechner et al. |
| 6,812,083 | B2 | 11/2004 | Shen et al. |
| 6,888,192 | B2 | 5/2005 | Lojek |
| 6,965,142 | B2 | 11/2005 | Diorio et al. |
| 7,046,549 | B2 | 5/2006 | Lee et al. |
| 7,071,507 | B2 | 7/2006 | Diorio et al. |
| 7,099,192 | B2 | 8/2006 | Wang et al. |
| 7,205,598 | B2 | 4/2007 | Voshell et al. |
| 7,283,390 | B2 | 10/2007 | Pesavento |
| 7,333,362 | B2 | 2/2008 | Gendrier et al. |
| 7,397,078 | B2 | 7/2008 | Solo De Zaldivar |
| 7,423,903 | B2 | 9/2008 | Lin |
| 7,449,754 | B2 | 11/2008 | Moore |
| 7,542,342 | B2 | 6/2009 | Kalnitsky |
| 7,633,810 | B2 | 12/2009 | Fang |
| 7,688,627 | B2 * | 3/2010 | Haggag et al. ............ 365/185.08 |
| 7,773,423 | B1 | 8/2010 | Bu |
| 7,903,465 | B2 | 3/2011 | Haggag |
| 2002/0121654 | A1 | 9/2002 | Yamamoto |
| 2002/0191439 | A1 | 12/2002 | Caywood |
| 2003/0161191 | A1 | 8/2003 | Matsuda et al. |
| 2006/0067124 | A1 | 3/2006 | Lee et al. |
| 2006/0281247 | A1 | 12/2006 | De Zaldivar |
| 2007/0109861 | A1 | 5/2007 | Wang et al. |
| 2007/0121381 | A1 | 5/2007 | Kalnitsky et al. |
| 2007/0247915 | A1 | 10/2007 | Kalnitsky et al. |
| 2008/0266959 | A1 | 10/2008 | Haggag et al. |

* cited by examiner

FLASH MEMORY ARRAY OF FLOATING GATE-BASED NON-VOLATILE MEMORY CELLS

This application is a divisional application of U.S. application Ser. No. 12/711,520 (the '520 Application) filed on Feb. 24, 2010, now U.S. Pat. No. 7,944,745, which is a divisional application of U.S. application Ser. No. 11/861,102 (the '102 Application) filed on Sep. 25, 2007, now U.S. Pat. No. 7,688,627, which claims the benefit of priority to U.S. Provisional Application No. 60/913,586 (the '586 Application), filed on Apr. 24, 2007. The '520 Application, the '102 Application, and the '586 Application are all incorporated by reference herein.

BACKGROUND

Non-volatile memory devices are used in applications that require stored information to be retained even when the memory devices are not powered. Examples of non-volatile memory devices include read-only memory (ROM), magnetic computer storage devices (e.g., hard disks, floppy disk drives), optical disc drives, erasable programmable read-only memory (EPROM), electrically erasable programmable read-only memory (EEPROM), and flash memory.

EEPROMs have been widely used in electronic products because of their non-volatile functions of electrically writing and erasing data. An EEPROM can be programmed and erased electrically using field emission (also known as "Fowler-Nordheim tunneling"). In the erase method of a conventional EEPROM, stored electric charges will move from a floating gate and be removed due to the Fowler-Nordheim tunneling (F-N tunneling) effect.

Flash memory is like EEPROM in that it can also be electrically erased and programmed. Flash memory stores information in an array of floating gate transistors, called "cells," each of which traditionally stores one bit of information. Newer flash memory devices, sometimes referred to as multi-level cell devices, can store more than 1 bit per cell by using more than two levels of electrical charge placed on the floating gate of a cell.

A limitation of conventional flash memory is that although it can be read or programmed a byte or a word at a time in a random access fashion, the flash memory has to erase multiple memory locations ("block") at a time. This generally sets all bits in the block to 1. Changing a single byte is only possible by rewriting a whole block. Starting with a freshly erased block, any location within that block can be programmed. However, once a bit has been set to 0, only by erasing the entire block can it be changed back to 1. In other words, conventional flash memory offers random-access read and programming operations, but cannot offer arbitrary random-access rewrite or erase operations.

Another limitation of conventional flash memory as applied to standard complementary metal oxide semiconductor (CMOS) processes is the number of additional masks required to embed a flash cell and the peripheral circuitry used in generation and routing of high voltage signals.

SUMMARY

The present invention is related to a flash memory array comprising a plurality of memory cells organized in a matrix of rows and columns. Each of the memory cells comprises a floating gate memory transistor having a source region and a drain region, and a coupling capacitor electrically connected to the memory transistor. A plurality of word lines are each electrically connected to the coupling capacitor in each of the memory cells in a respective row. A first set of bit lines are each electrically connected to the drain region of the memory transistor in each of the memory cells in a respective column. A plurality of high voltage access transistors are each electrically connected to a bit line in the first set of bit lines. A second set of bit lines are each electrically connected to the source region of the memory transistor in each of the memory cells in a respective column. Various combinations of voltages can be applied to the word lines and the first and second sets of bit lines in operations to erase, program, read, or inhibit a logic state stored by the memory transistor in one or more of the memory cells.

BRIEF DESCRIPTION OF THE DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the present invention. The following detailed description is, therefore, not to be taken in a limiting sense.

The complementary metal oxide semiconductor (CMOS) fabrication technology is a common fabrication technique for integrated circuits such as a p-channel and an re-channel MOSFET (metal oxide semiconductor field-effect transistor) referred to herein as PMOS and NMOS, respectively. Since CMOS technology continues to use 5V input-output (I/O) devices with a gate dielectric thickness in the range of about 10-15 nm, it is necessary to operate a memory cell at high positive erase voltages (e.g., about 12 V to about 22 V).

The present invention is directed to a two transistor (2T) flash memory array with EEPROM emulation capability that is built with PMOS floating gate-based non-volatile memory cells. The present flash memory array can be fabricated using conventional CMOS technology with a thick gate oxide (e.g., about 125 Å). The memory cells in the flash memory array can tolerate relatively high erase voltages.

The present invention addresses the limitations of conventional flash memory by providing a memory cell built out of elements native to CMOS technology. High voltage routing can be accomplished by devices capable of sustaining required voltages on one terminal (drain) only, such as extended drain or drift metal oxide semiconductor (DMOS) devices or true high voltage (HV) CMOS devices if present in a given process.

The present flash memory array is constructed with a two transistor architecture in each memory cell, including a storage transistor and a coupling capacitor in each cell. An access (or pull down) transistor is shared by a plurality of cells attached to a common column (bit line). Both the program and the erase operations are carried out by Fowler-Nordheim tunneling. The present flash memory array can be operated in a mode similar to traditional EEPROM in that the flash memory array allows byte by byte (and down to bit level) programming and erase.

Further details of the present invention are described as follows with respect to the drawings.

Figure 1:
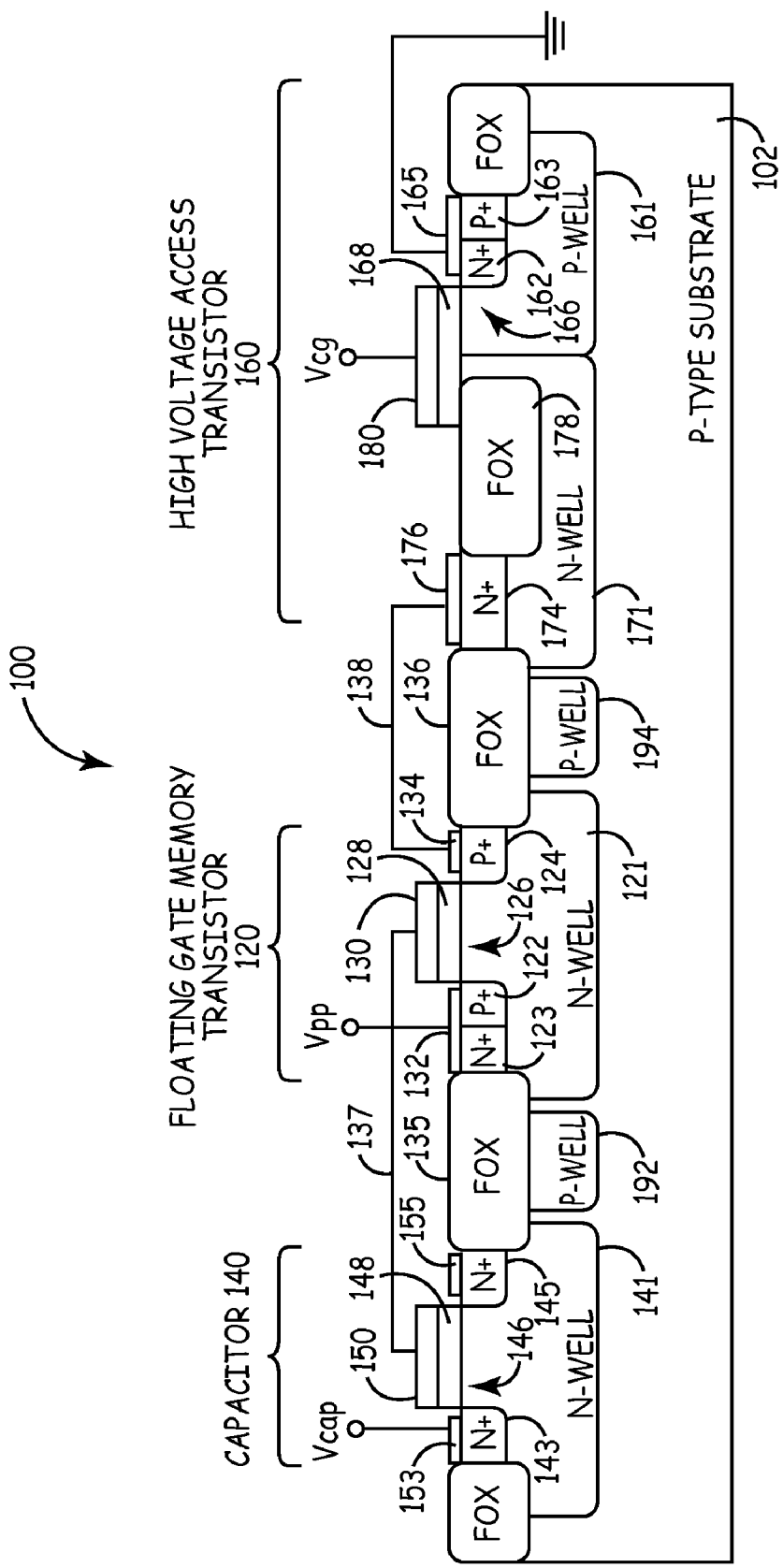
FIG. 1 is a schematic cross section view of a multiple time programmable memory cell according to one embodiment.

FIG. 1 depicts a cross section of a multiple time programmable (MTP) PMOS floating-gate based non-volatile memory cell 100 that can be employed in the flash memory array of the present invention. All elements of memory cell 100 can be built out of components intrinsic to a generic CMOS process flow with thick I/O oxide devices. The memory cell 100 generally includes a floating gate memory transistor 120, a coupling capacitor 140, and a high voltage access transistor 160. Each of these components is discussed in further detail hereafter.

The memory transistor 120 includes a p-type source region 122 spaced apart from a p-type drain region 124, both of which are formed in an n-type well 121 (N-well). The n-type well 121 is in turn formed in a p-type substrate 102. A channel region 126 is defined between source region 122 and drain region 124. A layer of gate oxide 128 is formed over channel region 126, and a floating gate 130 such as a layer of polysilicon is formed over gate oxide 128. Since gate 130 is isolated, it is often referred to as a floating gate. An n-type region 123 is also formed within n-type well 121 adjacent to p-type source region 122. The n-type region 123 provides an ohmic body tie to n-type well 121, so n-type well 121 can be tied to a terminal. A contact region 132 such as a layer of silicide is formed over p-type source region 122 and n-type region 123. A layer of silicide 134 can also be formed over p-type drain region 124. Silicide formation may be optionally excluded from the floating gate area by application of a conventional silicide block process. A field oxide (FOX) region 136 isolates memory transistor 120 from high voltage access transistor 160.

In the embodiment shown in FIG. 1, memory transistor 120 is a floating gate PMOS transistor. The memory transistor 120 may also be referred to as a storage transistor, because it can be programmed to store a logic state.

The coupling capacitor 140 includes spaced apart n-type diffusion regions 143 and 145 formed within an n-type well (N-well) 141, which is formed in p-type substrate 102. A channel region 146 is defined between n-type diffusion regions 143 and 145, and a layer of gate oxide 148 is formed over channel region 146. A polysilicon top plate gate layer 150 is formed over gate oxide 148 to form the coupling capacitor top plate. A contact region 153 such as a layer of silicide is formed over n-type diffusion region 143, and a layer of silicide 155 is formed over n-type diffusion region 145. A FOX region 135 isolates capacitor 140 from memory transistor 120. Alternatively, the coupling capacitor can be formed as a conventional PMOS transistor or a gated diode capacitor (not shown).

The high voltage access transistor 160 includes both a p-type well 161 (P-well) and an n-type well 171 (N-well). The n-type well 171 forms the drain of transistor 160, with an n-type region 174 providing an ohmic body tie to a silicide contact region 176. An n-type source region 162 is formed in p-type well 161. A channel region 166 is defined between n-type source region 162 and n-type well 171. A layer of gate oxide 168 is formed over part of the P-well and part of the N-well (including where they abut one another), and a gate 180 is formed over gate oxide 168, resulting in gate 180 being over channel 166. A p-type region 163 is also formed within p-type well 161, next to n-type source region 162. The p-type region 163 provides an ohmic body tie to p-type well 161 so that p-type well 161 is tied to ground.

A layer of silicide 165 is formed over n-type source region 162 and p-type region 163, to thereby form a contact region that is shown as being connected to ground. A FOX region 178 is formed in n-type well 171 to isolate silicide contact region 176 from gate 180. It is this isolation that enables access transistor 160 to withstand the higher voltages which occur during an erase operation.

In the embodiment shown in FIG. 1, high voltage access transistor 160 is a asymmetrical high voltage n-channel MOSFET (NDMOS) device. The high voltage access transistor 160 may also be referred to as a high voltage select transistor. Because of its extended drain 171, access transistor 160 can also be referred to as a high voltage extended drain NMOS transistor. Alternatively, an NDMOS device designed for optimum performance of a Bipolar CMOS DMOS (BCD) process can be employed as an access device. In a further alternative embodiment, if a technology supports a set of high voltage devices, these can be used as access transistors.

A symmetrical parasitic NDMOS device can also be used as an access transistor. This device will have two regions of field oxide under both edges of the gate polysilicon, with two N-wells used as S/D extensions and a P-well region entirely under the gate polysilicon region of the DMOS device (structure not shown).

A p-type well (P-well) 192 is used to electrically isolate n-type well 141 from n-type well 121, without contacting either of n-type well 121 or n-type well 141. Similarly, a p-type well (P-well) 194 can electrically isolate n-type well 121 from n-type well 171, without contacting either of n-type well 121 or n-type well 171. The inclusion of p-type wells 192, 194 separated from N-wells by a region of lightly doped Si allows for application of higher voltages by preventing punch-thru between the neighboring n-type wells 121, 141 and the neighboring n-type wells 121, 171. Because of their function, p-type wells 192, 194 can be referred to as isolation wells. A similar approach can be used to increase the breakdown voltage of the symmetrical or the asymmetrical NDMOS (i.e., P-well 161 can be separated from N-well 171 by a region of lightly doped Si).

In accordance with some embodiments of the present invention, each gate oxide layer 128, 148 and 168 can have a gate oxide thickness that is the same as the gate oxide thickness of CMOS devices that are used as I/O interface devices having an operating voltage of 5V. In other words, the thickness for gate oxide layers 128, 148 and 168 can be native to the fabrication process for 5V I/O devices. This enables capacitor 140 and transistors 120, 160 to be made using standard CMOS processes. For example, each gate oxide layer 128, 148 and 168 can have a thickness in the range of about 10-15 nm (i.e., about 100-150 Å). In some embodiments, the thickness of each gate oxide layer 128, 148 and 168 can be at least about 12 nm (i.e., at least about 120 Å). In other embodiments, a gate oxide layer thickness of up to about 20 nm (i.e., up to about 200 Å) can be used, enabling such embodiments to be useful with devices having even higher I/O voltages.

The memory cell 100 includes three terminals. A capacitor terminal (Vcap) is electrically connected to contact region 153 of capacitor 140. A program terminal (Vpp) is electrically connected to contact region 132 of memory transistor 120. The Vpp terminal can be used for both programming and erasing the memory cell. A control terminal (Vcg), also referred to as a select or access terminal, is electrically connected to gate 180 of access transistor 160.

The top plate 150 of capacitor 140 is electrically connected to floating gate 130 of memory transistor 120 by a trace 137. There is no contact to floating gate 130 of memory transistor 120. The capacitor 140 is designed to have a much higher capacitance (e.g., about 10 times) than that of memory transistor 120. The capacitor 140 capacitively couples floating gate 130 to n-type well 141. Thus, when a high erase voltage (e.g., about 14-22 V) is applied to the Vpp terminal, a voltage drop across gate oxide 128 forms a sufficient electric field for Fowler-Nordheim tunneling such that electrons are tunneled off floating gate 130. As also shown in FIG. 1, p-type drain region 124 of memory transistor 120 is electrically connected to n-type drain region 171 (through n-type region 174) of access transistor 160 by a trace 138. Use of the NDMOS access transistor allows high voltages required for cell erase to be applied to the Vpp terminal without causing two junctions (N-well-P+_in the memory device in series with the N-well-P-well or N-well to substrate) breakdown.

Further details with respect to memory cell 100, including additional alternative embodiments, are described in copending U.S. application Ser. No. 11/498,672, filed on Aug. 2, 2006, the disclosure of which is incorporated herein by reference.

Figure 2:
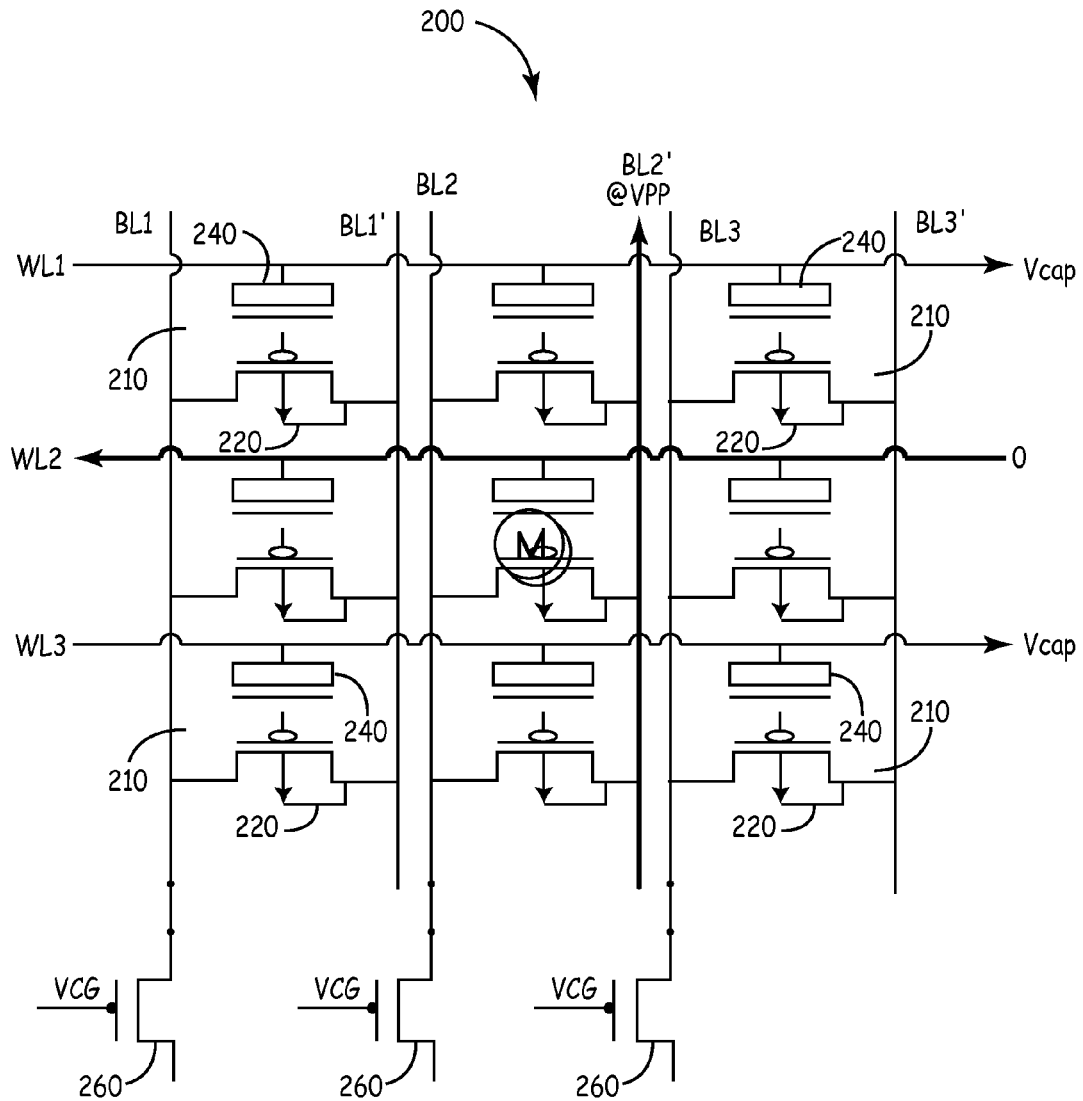
FIG. 2 is schematic representation of a flash memory array according to one embodiment, which illustrates the operation of an erase function.

FIG. 2 is a schematic representation of a two-dimensional 2T flash memory array 200 according to one embodiment of the invention. The flash memory array 200 includes a plurality of memory cells 210 organized in a matrix of rows and columns. Although three rows and three columns are shown, it should be understood that any number of rows and columns of memory cells can be formed, and is only limited by the number of cells that can be formed on a particular chip.

Each of the memory cells 210 includes a floating gate memory transistor 220 and a coupling capacitor 240, which can correspond to memory transistor 120 and capacitor 140, respectively, as discussed with respect to FIG. 1. The floating gate memory transistor 220 is configured to store a logic state. The coupling capacitor 240 is electrically connected to floating gate memory transistor 220.

The memory cells 210 are connected together in a matrix by word lines and bit lines arranged in a plurality of rows and columns. A plurality of word lines (WL1, WL2, WL3, etc.) provides a Vcap bus line that is electrically connected to each capacitor 240 in a respective row. A first set of bit lines (BL1, BL2, BL3, etc.) are each electrically connected to a drain region of memory transistor 220 in each of the memory cells in a respective column. A plurality of high voltage access transistors 260, which are configured to withstand a high voltage on at least a drain terminal, are each electrically connected to a respective bit line BL1, BL2, BL3, etc. Each of these bit lines provides a Vcg select signal that electrically connects an access transistor 260 to a respective memory transistor 220 connected to the first set of bit lines in each column.

A second set of bit lines (BL1', BL2', BL3', etc.) each provides a bus line that is electrically connected to a source region of memory transistor 220 in each of the memory cells along a respective column. Various combinations of voltages can be applied to the word lines and the bit lines to program, inhibit, read, or erase the logic state stored by memory transistor 220 in one or more of the memory cells.

In a method of erasing a single bit in a memory cell of flash memory array 200, a word line connected to capacitor 240 in the memory cell to be erased is grounded. A first voltage is applied to a bit line connected to the source region of memory transistor 220 in the memory cell to be erased. A second voltage is applied to word lines not connected to the memory cell to be erased, with the second voltage being about one-half of the first voltage. A bit line connected to the drain region of memory transistor 220 in the memory cell to be erased is also grounded. A third voltage is applied to bit lines, in the second set of bit lines, not connected to the memory cell to be erased, with the third voltage being about one-half of the first voltage.

In a method of programming a single bit in a memory cell of flash memory array 200, a first voltage is applied to a word line connected to capacitor 240 in the memory cell to be programmed. A bit line connected to the source region of memory transistor 220 in the memory cell to be programmed is grounded. A second voltage is applied to bit lines, in the second set of bit lines, not connected to the memory cell to be programmed, with the second voltage being about one-half of the first voltage. A bit line connected to the drain region of memory transistor 220 in the memory cell to be programmed is grounded. Word lines that are not connected to the memory cell to be programmed are also grounded.

In a method of reading a single bit in a memory cell of flash memory array 200, a word line connected to capacitor 240 of the memory cell to be read is grounded. A first voltage is applied to a bit line connected to the source region of memory transistor 220 in the memory cell to be read. A second voltage is applied to a bit line connected to the drain region of memory transistor 220 in the memory cell to be read. The second voltage is applied to the gate of access transistor 260 at terminal Vcg, with the access transistor coupled to the bit line connected to the drain region. The second voltage is larger than the first voltage or enough to turn "on" the access transistor. A third voltage is applied to word lines not connected to the memory cell to be read, with the third voltage being at least about half the first voltage.

Further details regarding erase, program, and read operations for the present flash memory array are discussed hereafter.

As mentioned previously, erase and program operations in an EEPROM memory array are carried out by Fowler-Nordheim (F-N) tunneling. The use of F-N tunneling for both programming and erasing a memory cell in the EEPROM memory array requires the lowest possible operating current. Such an operation mode can also increase cell endurance and data retention time. FIG. 2 further illustrates the operation of an F-N erase function at the bit level for a cell M of flash memory array 200. In order to erase cell M, an erase voltage sufficient to create an electric field needed for F-N tunneling through the gate oxide of the memory transistor 220 is applied to the Vpp terminal of cell M, while the Vcg terminal and the Vcap terminal of cell M are connected to ground. For example:

(1) To erase cell M at WL=2 and BL=2: WL2=0, BL2'=Vpp, Vcg=0;
(2) Column 2 inhibit: for all cells on BL2' apply Vpp/2 on WL1 and WL3.
(3) All cells on WL1 and WL3 will see Vpp/2 thus:
   a. If a cell is already erased, Vpp/2 is not enough to program it.
   b. If a cell is already programmed, Vpp/2 will not disturb its state.
(4) Row inhibit: all cells on WL2 will see VWL=0;
   a. If a cell on WL2 is erased, VWL2=0 will cause no disturb;
   b. Same if a cell on WL2 is programmed.

In order to erase cell M (one bit) of memory array 200, capacitor 240 in cell M needs to go high (e.g., about 17-18 V). Accordingly, bit line BL2 needs to go high and word line WL2 needs to go to a zero potential. With this configuration, a voltage is applied to bit line BL2' (VPP), and this voltage is divided between memory transistor 220 and capacitor 240 in cell M. Since the memory transistor is designed to be considerably smaller than the capacitor, most of the voltage is dropped across the memory transistor. The potential is positive on the N-well and zero or close to zero on the floating gate of the memory transistor. By applying these potentials, electrons can be injected from the floating gate into the substrate of cell M.

In order to protect the rest of memory array 200 from being erased, word lines that are not grounded such as WL1 and WL3, which are connected to cells in the same column as cell M, need to be kept at approximately one-half the potential VPP to prevent an erase. In order to prevent erasure of cells to the left and to the right of cell M, bit lines BL1' and BL3' also need to be kept at about one-half VPP.

In addition, the erase operation can also be used to simultaneously erase all cells connected to a common Vpp bus. If desired, the whole flash memory array can be erased at the same time by applying high voltage to every bit line prime (BL1', BL2', BL3', etc.) and ground to every word line (WL1, WL2, WL3, etc.).

Figure 3:
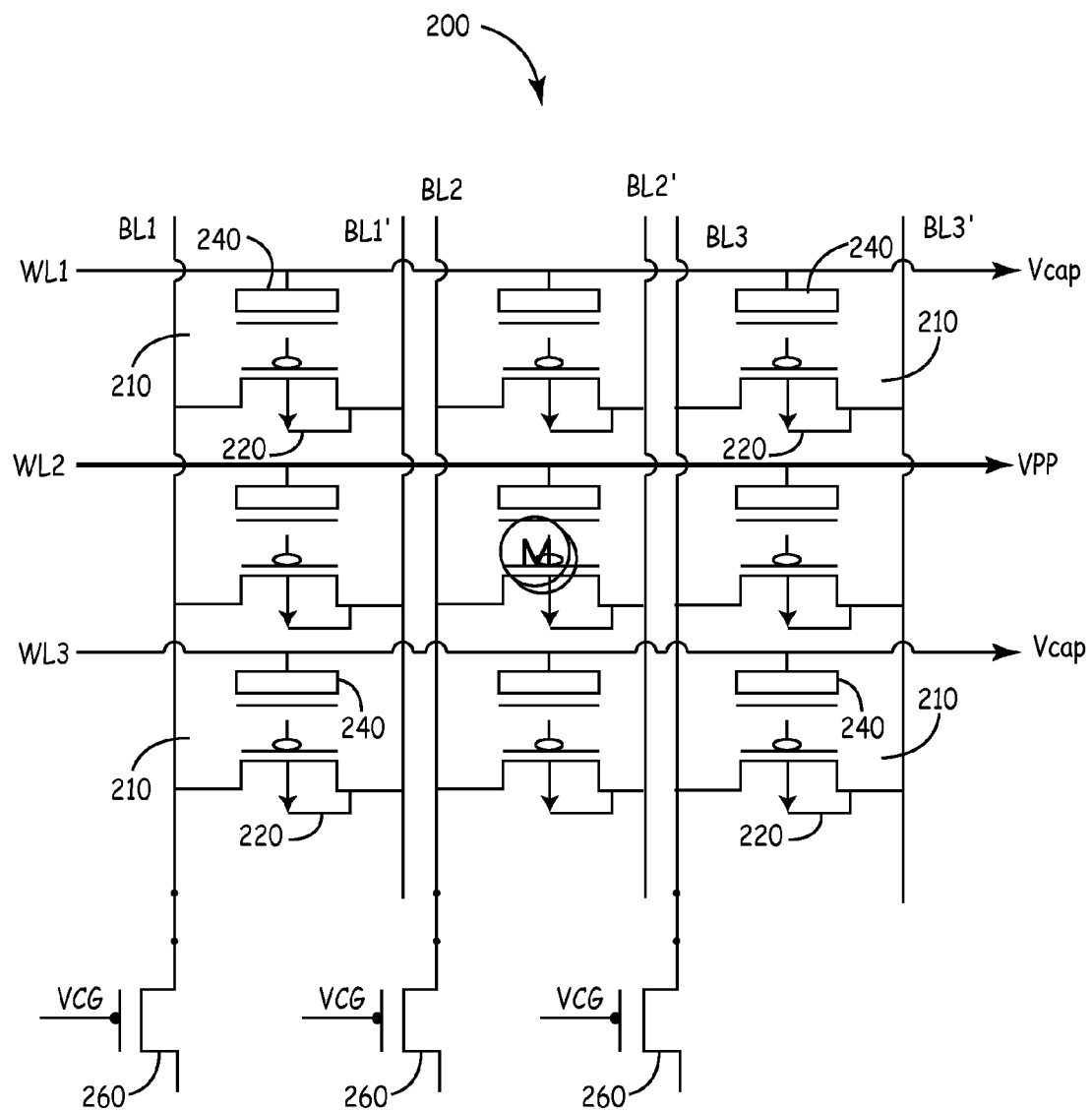
FIG. 3 depicts the flash memory array of FIG. 2, but illustrates the operation of a programming function.

FIG. 3 depicts flash memory array 200 as described above with respect to FIG. 2, but illustrates the operation of an F-N programming function at the bit level. The use of F-N programming provides the lowest power consumption available to program a memory cell. In general, a programming voltage level is achieved by application of a high voltage to the Vcap terminal, while the Vcg terminal and the Vpp terminal are grounded. In order to program a single cell, a high voltage is applied to an associated word line.

A program condition for the programming function of flash memory array 200 at the bit level for a single cell M is as follows:
(1) To program cell M at WL=2 and BL=2: WL2=Vpp, BL2'=0, Vcg=0;
(2) Row-2 inhibit: all cells on WL2 will see Vpp; apply Vpp/2 on BL1' and BL3'.
   a. If a programmed cell is on BL1' or BL3' sees Vpp/2; not enough to erase,
   b. If an erased cell is on BL1' or BL3' sees Vpp/2; don't care.
(3) Column 2 inhibit: all cells on BL2' will see BL=0, WL1=WL3=0 or floating. No disturb in WL1 or WL2 for erased or programmed cells.

In a programming mechanism to program cell M (one bit), a high voltage is applied to word line WL2 (VPP). When the high VPP is applied to capacitor 240 of cell M and ground is applied to bit line BL2', the inverse of the erase operation occurs. A high voltage is dropped across the floating gate of memory transistor 220 of cell M, with zero or close to zero volts in the substrate of cell M, which causes injection of electrons from the substrate into the floating gate.

One cell can be programmed one bit at a time by keeping other cells from being programmed. For example, with respect to the cells to the left and to the right of cell M in FIG. 3, if BL1' and BL3' both have a voltage applied which is approximately one-half of VPP, the programming of these cells is inhibited. For cells on different word lines, it is enough to ground these word lines and no programming will take place.

Figure 4:
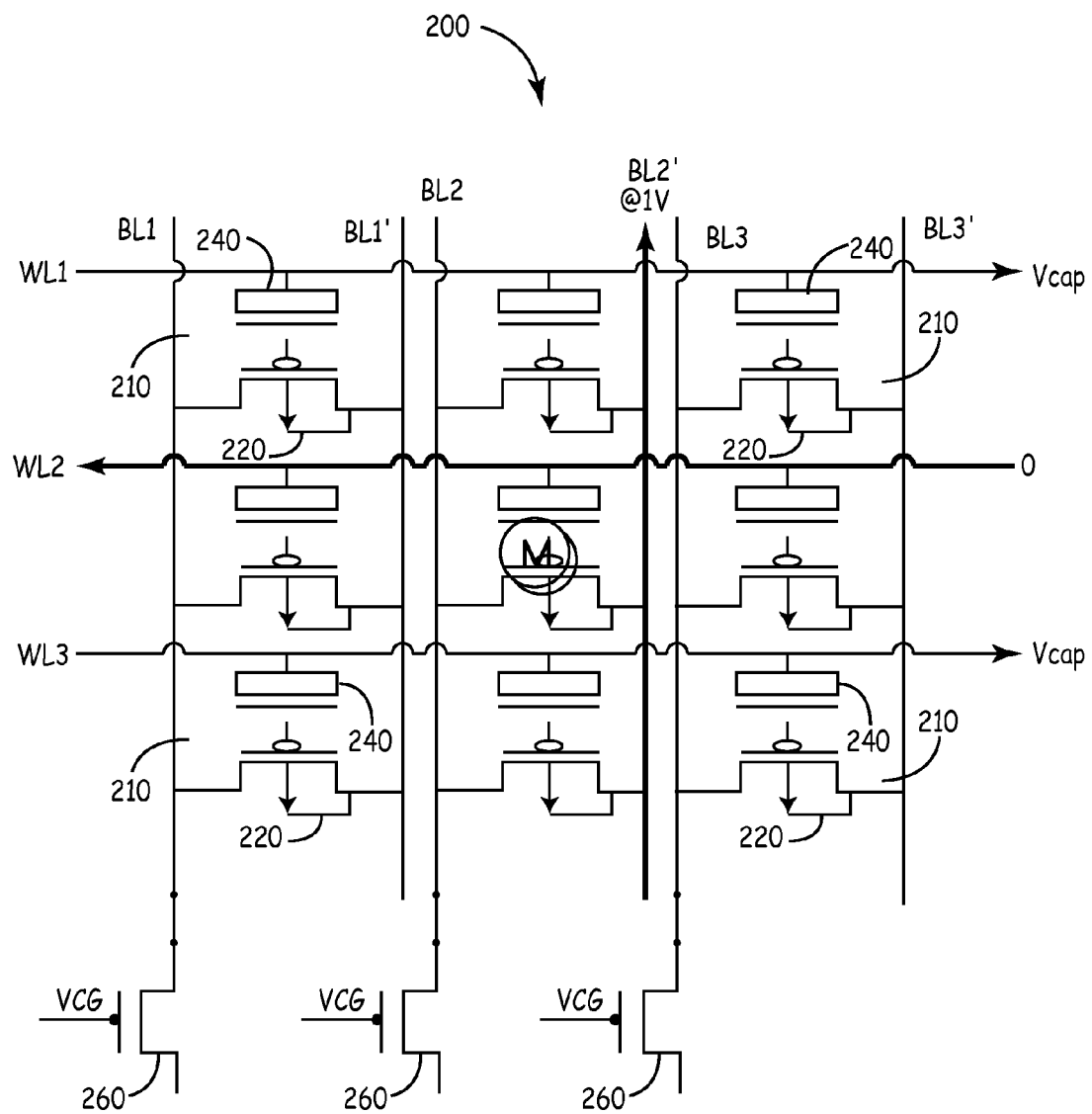
FIG. 4 depicts the flash memory array of FIG. 2, but illustrates the operation of a read function.

FIG. 4 depicts flash memory array 200 as described above with respect to FIG. 2, but illustrates the operation of a read function at the bit level for a cell M. The memory cell M can be read by applying a significantly lower read voltage (e.g., approximately 1 V) to the Vpp terminal while the Vcg terminal receives a select voltage level such as about 5 V.

A program condition for the read function of flash memory array 200 at the bit level for cell M is as follows:
(1) To read cell M at WL=2 and BL=2: VBL2'=1V, Vcg of BL2=5V;
(2) Column inhibit: all cell on BL2' will see 1V;
   a. If a cell is already programmed on BL2 (it is on), then to inhibit read disturb, VWL1=VWL3=VPP/2 or at least the logic level (e.g., about 5V),
     i. Then, all cells on WL1 and WL3 will see VWL inhibit. For an erased cell, VPP/2 is not enough to program.
     ii. For a programmed cell (on), don't care.
   b. If a cell is already erased on BL2'=1V, don't care.

In a read operation for cell M (one bit), which is attached to bit line BL2, the cell is activated by applying a relatively low voltage (about 1V) to memory transistor 220 of the cell. If cell M has been previously programmed such that it is in a conductive state, the cell will conduct word line voltage WL2=0, and will have a current flow from bit line BL2' through the cell, and through the column access transistor 260 (VCG) connected to bit line BL2. When 1 volt is applied to bit line BL2' for a read operation, the cells above and below cell M in the same column may conduct and such conduction needs to be blocked. Accordingly, the word lines WL1, WL3, etc. for the cells in the same column as cell M that are not being read need to be at a high voltage (e.g., VPP of about 2-5 volts) in order to block conduction. If any of these unread cells are programmed, a higher voltage level is needed to block conduction than if the cells have been erased.

The present invention may be embodied in other specific forms without departing from its essential characteristics. The described embodiments and methods are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A method of erasing a single bit in a memory cell of a flash memory array, the method comprising:
   providing a flash memory array comprising a plurality of memory cells organized in a matrix of rows and columns, each of the memory cells comprising:
     a floating gate memory transistor;
     a program terminal electrically connected to the memory transistor;
     a coupling capacitor electrically connected to the memory transistor; and
     a capacitor terminal electrically connected to the coupling capacitor;
   wherein a plurality of word lines are each electrically connected to the coupling capacitor in each of the memory cells in a respective row, and a first set of bit lines are each electrically connected to the memory transistor in each of the memory cells in a respective column;
   wherein a plurality of high voltage access transistors are each electrically connected to a bit line in the first set of bit lines, and a control terminal is electrically connected to each access transistor;
   wherein a second set of bit lines are each electrically connected to the program terminal in each of the memory cells in a respective column;
   grounding the capacitor terminal of the memory cell to be erased;
   applying a first voltage to the program terminal of the memory cell to be erased;

applying a second voltage to capacitor terminals not connected to the memory cell to be erased, the second voltage being less than the first voltage;

grounding the control terminal of the access transistor electrically connected to a bit line, in the first set of bit lines, connected to the memory transistor of the memory cell to be erased; and applying a third voltage to program terminals not connected to the memory cell to be erased, the third voltage being less than the first voltage.

2. The method of claim 1, wherein the second voltage is about one-half of the first voltage.

3. The method of claim 1, wherein the third voltage is about one-half of the first voltage.

4. The method of claim 1, wherein erasing of the single bit is carried out by Fowler-Nordheim tunneling.

5. A method of erasing a single bit in a memory cell of a flash memory array, the method comprising:

grounding a word line connected to the memory cell to be erased;

applying a first voltage to a bit line connected to a source region of a memory transistor in the memory cell to be erased;

applying a second voltage to word lines not connected to the memory cell to be erased, the second voltage being less than the first voltage;

grounding a bit line connected to a drain region of the memory transistor in the memory cell to be erased; and applying a third voltage to bit lines connected to source regions of memory transistors not connected to the memory cell to be erased, the third voltage being less than the first voltage.

6. The method of claim 5, wherein the second voltage is about one-half of the first voltage.

\* \* \* \* \*